United States Patent
Zink et al.

(10) Patent No.: US 7,732,789 B2
(45) Date of Patent: Jun. 8, 2010

(54) OPTICAL SYSTEM HAVING A CLEANING ARRANGEMENT

(75) Inventors: Peter Zink, Eindhoven (DE); Gunther Hans Derra, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 693 days.

(21) Appl. No.: 11/572,238

(22) PCT Filed: Jul. 18, 2005

(86) PCT No.: PCT/IB2005/052379

§ 371 (c)(1),
(2), (4) Date: Jan. 17, 2007

(87) PCT Pub. No.: WO2006/011105

PCT Pub. Date: Feb. 2, 2006

(65) Prior Publication Data

US 2009/0014666 A1    Jan. 15, 2009

(30) Foreign Application Priority Data

Jul. 22, 2004 (EP) .................................. 04103506

(51) Int. Cl.
*G03F 7/20* (2006.01)
(52) U.S. Cl. ........................................ 250/492.2; 134/1
(58) Field of Classification Search ....................... None
See application file for complete search history.

(56) References Cited

U.S. PATENT DOCUMENTS

| | | | |
|---|---|---|---|
| 6,452,199 B1 * | 9/2002 | Partlo et al. .............. | 250/504 R |
| 6,923,625 B2 * | 8/2005 | Sparks ........................ | 417/48 |
| 2004/0007246 A1 | 1/2004 | Chan et al. | |
| 2004/0165160 A1 * | 8/2004 | Van Beek et al. ............. | 355/30 |
| 2005/0244572 A1 | 11/2005 | Bristol et al. | |

FOREIGN PATENT DOCUMENTS

| | | |
|---|---|---|
| EP | 1182510 A1 | 2/2002 |
| EP | 1182510 B1 | 2/2002 |
| EP | 1213617 A1 | 6/2002 |
| EP | 1406124 A1 | 4/2004 |
| EP | 1429189 A1 | 6/2004 |
| EP | 1531365 A1 | 5/2005 |
| EP | 1643310 A1 | 4/2006 |
| WO | 2004104707 A2 | 12/2004 |

* cited by examiner

*Primary Examiner*—Jack I Berman

(57) ABSTRACT

A cleaning arrangement for an optical system and in particular for an optical system designed for EUV radiation. The cleaning arrangement has a gas inlet (28) for a reactive gas (29). Contaminants (23) that have deposited on the surface of optical elements (110) are detached by the reactive gas. Also provided are getter surfaces (32) that are preferably arranged opposite the surfaces to be clean and by which the contaminants detached from these surfaces are absorbed. This absorption may take place as a result of condensation on the getter surface and also by chemical reaction.

17 Claims, 3 Drawing Sheets

OPTICAL SYSTEM HAVING A CLEANING ARRANGEMENT

The invention relates to a cleaning arrangement for optical systems, having a gas inlet for a cleaning gas. Contaminants which have settled on the surface of optical elements are detached by the gas.

It is known from EP 1213617 that, if a directed feed of oxygen takes place into a lithography unit, the radiation used for exposure is, in itself, enough, on its exposing beam path, to clean the interior of the unit of contaminants. For this purpose, the degree of contamination is continuously determined and compared with preset threshold values. The feed of oxygen to the lithography unit is adjusted as a function of the current degree of contamination. The oxygen that is fed in is activated on the exposing beam path and, as a result of diffusion and slight convection, becomes distributed throughout the whole of the interior of the lithography unit. The gas then reacts with the films of contaminant material. The infeed of oxygen is not however a suitable way of removing metallic contaminants.

Known from US 2004/0007246 is an EUV lithography system having an arrangement for decontaminating the collector. The cleaning of the collector is accomplished by means of reactive discharges in an atmosphere containing fluorine. With this method a plasma has first to be generated, by high-frequency technology or microwaves for example. When this method is employed, materials which are resistant to the chemically reactive fluorine radicals have to be used.

It is an object of the invention to provide a cleaning arrangement for an optical system by which contaminants can be removed from optical elements.

The optical system according to the invention has a cleaning arrangement having a reactive-gas inlet and a getter surface arranged off the beam path. Contamination of the optical elements is prevented, or at least reduced, in this way. The contaminants present on the optical surface are detached therefrom by the incident radiation as a result of the latter co-operating with the reactive gas, and change back to the gas phase. When the contaminants impinge on the at least one getter surface, said contaminants are bound by the getter surface.

To assist the permanent binding of the contaminants, provision may be made for a getter gas, which causes the contaminants to be absorbed by the getter surface as a result of a chemical reaction, to be directed onto the getter surface. This getter gas can be admitted through one or more getter-gas inlets provided in the surface.

Because the getter surfaces are arranged off the beam path, they are less severely heated by the EUV radiation. Permanent binding of the contaminants to the getter surface is encouraged simply by this means.

The absorption of the contaminants by the getter surface may be assisted by a getter surface designed to be of a porous form. The getter surface thus has a large surface area available for the absorption of contaminants.

The absorption of contaminants on the getter surface may be encouraged by the admission of a getter gas, preferably through a plurality of gas inlets. Provision may also be made for the getter gas to be introduced through pores formed in the getter surface.

As an alternative to, or in addition to, the getter gas, provision may also be made for the use of a getter surface provided with a coating. The contaminants impinging on the getter surface are bound by the getter surface as a result of this coating.

Also as an alternative or in addition, provision may be made for the getter surface to be cooled. Provision may even be made for the getter surface to be cooled only at times.

By replacing the getter surfaces, the contaminants can be removed from the system permanently. Hence the getter surfaces may also be used to improve the vacuum.

The getter gas selected, or the coating selected for the getter surface, will preferably be one that supports particularly the absorption of inorganic substances such as tin, indium, antimony, tellurium, lithium, molybdenum, tungsten and compounds thereof, such as for example carbides, nitrides or oxides. What is of particular interest however is the absorption of carbon or carbon-containing compounds which form contaminants.

Provision may be made for a halogen or hydrogen, a halogen or hydrogen radical, or a compound containing halogen or hydrogen to be used as a reactive gas. The reactive gas can be used together with an inert gas.

Pore-like openings may be provided for the admission of the reactive gas. These openings may be arranged in the getter surface, or in the exposed surface or adjacent to the latter.

These and other aspects of the invention are apparent from and will be elucidated with reference to the embodiments described hereinafter.

Figure 1:
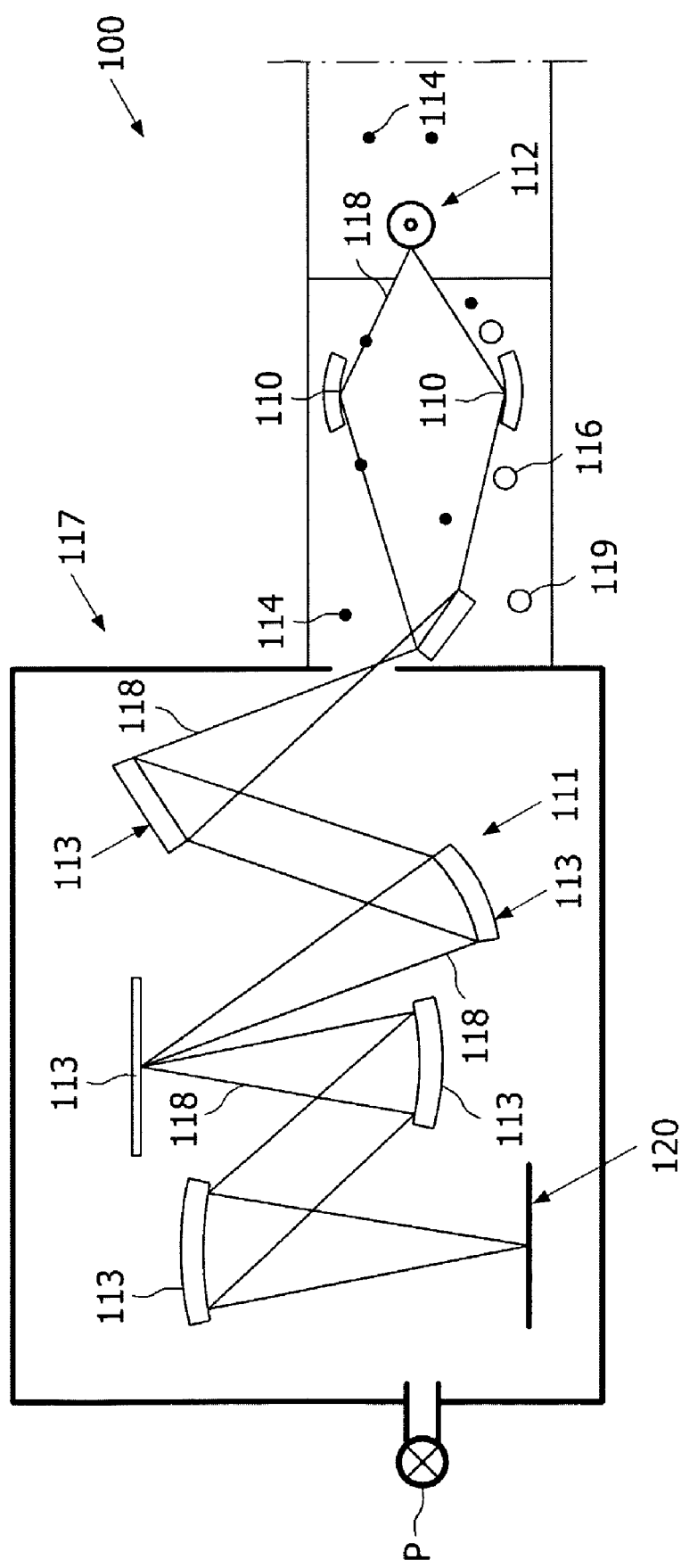
FIG. 1 is a schematic representation of an EUV imaging system.

In optical lithography for the semiconductor industry, use is made of costly and complicated optical systems to ensure the high standard of imaging required. Particularly in lithography using extreme ultraviolet radiation, referred to in what follows as EUV lithography, mirror optical elements 110 are used to form an image of the structure of a mask on a wafer. In the embodiment shown in FIG. 1, there are collector mirrors 110 and mirrors 113 situated in a vacuum system 117, 2 having a pump P, 4, between a radiation source 112 and a silicon wafer 120. In EUV lithography, mirror optical systems 111 are used to keep any absorption of the EUV radiation low. Because of the severe absorption of EUV radiation that would occur, no windows can, at the moment, be provided between the radiation source 112 and the optical system 110, 111. Instead, the radiation source and illuminating optical system form, together with a mask (not shown) and the wafer 120, a continuous vacuum system 117. The vacuum is needed because gases too cause severe absorption of EUV radiation.

The continuous vacuum system 117 means that gases and particles from the light source can make their way to the optical system 110, 111. There, they constitute dangerous contaminants that may reduce the quality of the optical components 110, 113.

Either discharge plasmas or laser plasmas are available as radiation sources 112 for EUV lithography. In both cases, a very hot plasma is produced in which multiply ionized ions radiate in the short-wave EUV range. In discharge plasmas, the plasma is generated and heated by the electrical energy of the discharge. In laser plasmas, a laser applies a very high power to a gaseous, liquid or solid target, by which means a hot plasma is generated.

Substances that radiate effectively in the EUV range, and in that range above all at the wavelength of 13.5 nm that is particularly advantageous for multi-layer mirrors, are xenon, lithium, tin, indium, antimony and tellurium. Whereas xenon, as an inert gas, is easily volatile, the metallic substances are difficult to volatilize. If there were no cleaning arrangement present, they could make their way from the radiation source to the optical components and condense on them.

Hence, layers would form on the optical components and particularly on the collector mirrors 110. In this way, reflectivity would decrease at the mirrors due to absorption losses in these layers. In view of the many reflections at mirrors that are required before the radiation reaches the wafer 120, reflection losses have a very severe effect on the intensity of radiation that is available. Because the intensity of the radiation, and with it the throughput of wafers per unit of time, is a very critical factor, reflection losses need to be avoided. Deposits of contaminants may cause a degradation of the reflectivity of the mirrors, both over time and in space.

The intention is for the optical components to be cleaned of deposited substances while the system is operating by the cleaning arrangement provided and by the method of cleaning. By this means, EUV illumination of the mask and the wafer that is uniform over time and space is ensured.

By reference to FIG. 1, there will be described the principle of operation of an arrangement according to the invention for cleaning optical components 110 that are so arranged in a system 100 for EUV lithography that, inside a vacuum system 117, radiation from a radiation source 112 is directed onto a workpiece to be processed, which is in particular a wafer 120, thus forming a beam path 118. In particular, the radiation source 112 produces extreme ultraviolet and/or soft X-rays in this case. The radiation is generated in this case in the radiation source 112 by a hot plasma. To generate this plasma, use may be made both of a working gas able to be excited by electrical discharge, such as the vapor of a metal for example, and of a target which is vaporized by pulses of a laser beam. In both cases, inorganic substances 114, preferably a metal-containing, and in particular tin-containing, substance, are introduced into the vacuum system 117 by the radiation source 112, and these foul, in particular, the optical components 110.

Figure 4:
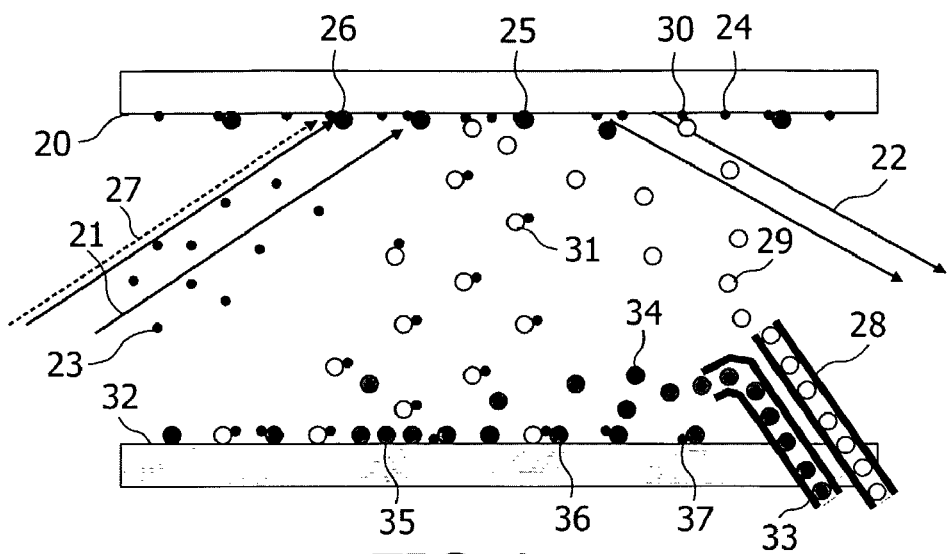
FIG. 4 is a detail view of a portion of the collector in which there is an inlet for reactive gas and an inlet for getter gas.
Figure 5:
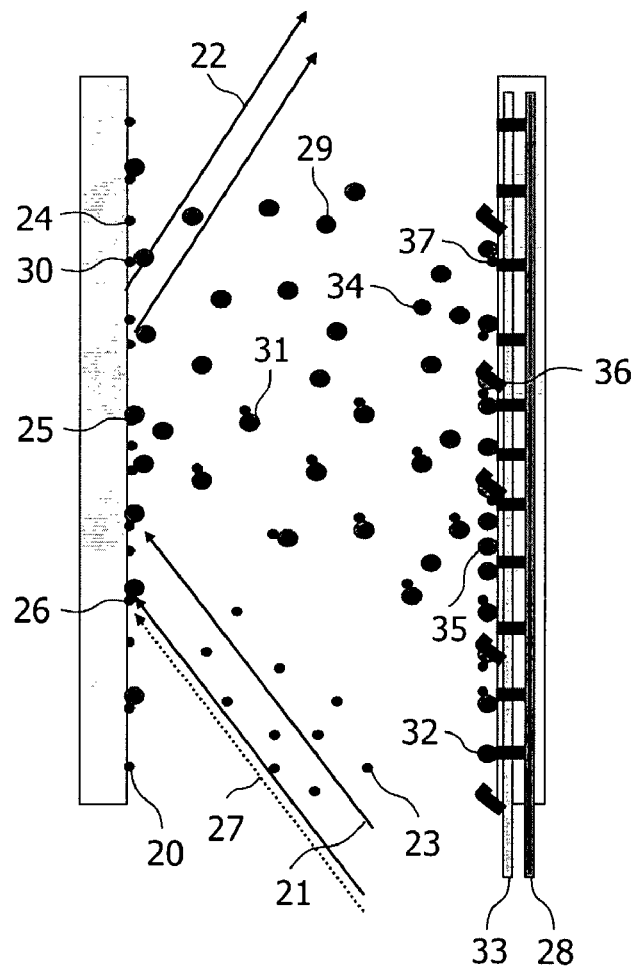
FIG. 5 is a view of a portion of the collector in which the inlets for getter gas and reactive gas are incorporated in the getter surface.

As a result of the admission, which is to be performed mainly during the operation of the system 100, through a reactive-gas inlet 28 shown in FIGS. 4 and 5, of a reactant 119 which is preferably gaseous and/or liquid under the conditions of temperature and pressure prevailing in the vacuum system 117, a chemical reaction is initiated with the inorganic substance 114 and in particular with the deposited contaminants 25 fouling the optical components 110, as shown in FIGS. 4 and 5. When this happens, the deposits 25 are changed into a volatile compound 31. The reactive gas 29 fed in through the reactive-gas inlet 28 is so selected, as a function of the contamination 23 expected, that both a fast and also a selective conversion can take place, in order to largely avoid any subsidiary reactions which might possibly take place with, for example, parts of the vacuum system 117. Something else that needs to be avoided is the mirror surfaces being attacked by the reactive gas.

Because, unlike the optical components 113, in particular the optical components 110 shown here are situated relatively close to the radiation source 112, it is advisable for the reactive gas 29 to be fed in between the radiation source 112 and the optical components 110. A higher rate of deposition of the inorganic substance 114 can be expected in this region.

What may be considered as reactive gases 29 are in particular hydrogen-containing substances and/or halogens and interhalogen-containing and halogen-containing compounds and/or a combination thereof. Radicals are particularly suitable due to their high reactivity. Elemental chlorine for example exhibits low absorption for EUV rays in this case and easily forms highly reactive chlorine radicals in the vacuum system 117. The chlorides that are formed in the chemical reaction often have appreciably higher vapor pressures and hence lower boiling points than the inorganic cations contained therein. In this way, elemental tin for example boils at approximately 2687° C. under normal conditions, whereas SnCl2 boils at approximately 605° C. and SnCl4 at only approximately 114° C. under the same conditions.

In particular, the reactive gas 29 is fed in while the radiation source 112 is operating, to prevent any contamination of the optical components 110 as a result of the process described here. This infeed of the reactive gas 29 may be controlled to be both continuous and in the form of pulses, in such a way that it takes place as a function of the predetermined kinetics of the reaction.

Provision may also be made for two different reactive gases to be admitted. The first reactive gas is intended to change the contaminants present on the optical surface. What is preferably used for this is a radical that is also only produced by the incident radiation. It is true that radiation is also absorbed when this happens but the reduction that is thereby caused in the radiation, e.g. of 13.5 nm, selected for the imaging, is very small and can thus be ignored.

The detachment of the contaminants from the optical surface in the gas phase can be assisted by the second reactive gas. This gas may be, but does not have to be, fed in selectively during the breaks in the radiation. In this way, use could also be made of the breaks in radiation between the individual wafer-exposing processes.

By limiting it in space and time, the infeed of the reactive gas takes place in excess or to the point of chemical equivalence relative to the amount of contaminants 23 introduced by the radiation source 112, in order to achieve complete conversion of the reactive gas 29.

To enable the optimum quantity of the reactive gas 29 to be fed in under control, a measuring means may be provided. This measuring means may for example detect the intensity of the radiation that is reflected by the collector 110. This is preferably done whenever a mask and/or a wafer 120, 5 have to be changed during the lithographic process.

Figure 2:
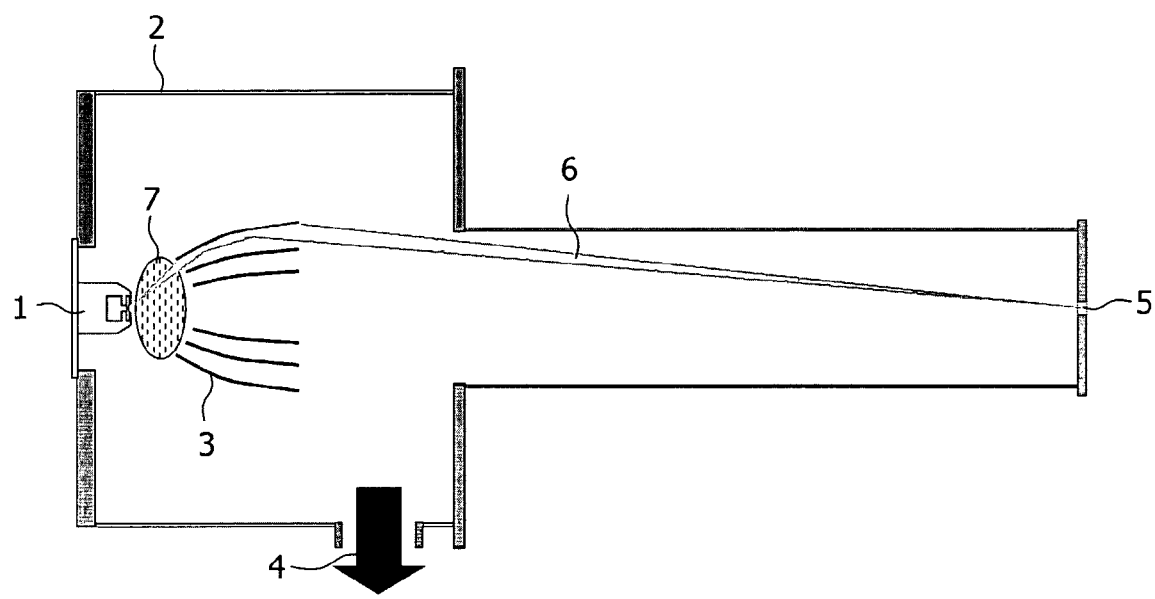
FIG. 2 is a schematic representation of a source of EUV radiation having a collector as an optical system
Figure 3:
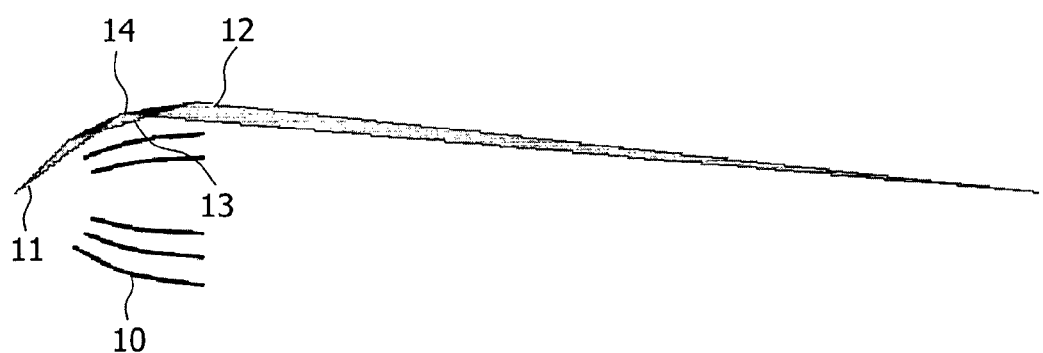
FIG. 3 is an enlarged view of the collector of FIG. 2.

In what follows, the cleaning of an optical component will be explained in detail by reference to FIGS. 2 and 3, taking the collector as an example. What is shown in the Figures is an illustrative layout having three collector shells 3, 10 which are symmetrical in rotation. The light beams 6, 12 coming from the radiation source 1 pass through a debris-suppression system 7. The term "debris" also refers to the contaminants originating from the radiation source. What is provided as a debris-suppression system may for example be a foil trap. Having passed through the debris-suppression system, the radiation is reflected at the collector 10. The surface 13 which reflects, and which thus has to be cleaned as well, is exposed to the light source 1. The rear side of each collector shell 10 represents a surface 14 that is in shadow in relation to the light source 1. This surface 14 does not perform any optical function. In the present case, the cleaning is to be performed by removing deposited debris material from the surfaces 13 that are exposed to the light source 1 and depositing it on the surfaces 14 that are in shadow.

The removal of the contaminants 24 deposited on the optical surface takes place as a result of a reaction 30 of the contaminant material 24 with a reactive gas 29, referred to below as a cleaning gas, to form a volatile product 31 which then vaporizes into the gas phase.

By diffusion, at least part thereof makes its way to the surface 14 situated directly opposite which is shaded off from the light source. On this surface, or in the neighborhood of this surface, the compound impinges on a getter substance 34, 35. The getter substance may either be fed in as a getter gas 34 in this case, or may already be present as a layer 35 on the getter surface 32.

A reaction, and hence a binding process, takes place on the getter surface or with the getter substance in the respective cases. In this reaction, the volatile compounds composed of the contamination and the reactive gas 29 are changed into a non-volatile compound composed of the contamination 23 and the getter substance 34 and possibly the reactive gas 29. The getter substance is selected in such a way in this case that the non-volatile compound 36 is more stable than the volatile compound 31 that existed previously. The getter reaction in question is therefore not spontaneously reversible and the stable non-volatile substance remains on the surface 14 in shadow in a condensed form.

By this mechanism, contaminants, also referred to as debris material, are effectively caused to be transported from the surfaces 13 to be cleaned to the rear sides of the collector shells 14. These surfaces 14 in shadow form getter surfaces 32.

If the reaction mechanisms were considered without any great thought, it might not at first be possible to rule out the possibility of the getter reaction described above occurring on the surface 13 to be cleaned as well, if the getter gas 34 also made its way there. This would slow down, or even prevent, the transportation away of the debris material. Also, the getter gas 34 might react directly with the deposited material and form the stable non-volatile compound, and the formation of the volatile compound composed of deposited material 23 and reactive gas 29 would thus not take place.

However, in the case of the present invention, advantage can be taken of the fact that the surface 13 in question is exposed to the light source 1. As a result of the impingement of high-energy photons 26, electrons and ions 27 from the plasma at the radiation source 1, a stable compound 25 formed between deposited material 24 and getter gas 34 is always dissociated again, which means that the release of the deposited material 24 happens repeatedly. There is a further mechanism in that the incident photons 26 are first able to detach a photo-electron from the surface, and this photo-electron then results in the compound dissociating. Finally, at least part of the deposited material released can react with the reactive gas 29, vaporize and diffuse to the surface in shadow situated opposite. There, it is stably bound as a result of reacting with the getter substance 35, 34 and cannot be released again, because the surface 14 in question is in shadow in relation to the light source 1.

Hence, what is obtained is transport of the net amount of deposited material from the exposed surface 13 to the surface 14 in shadow. The stable non-volatile compound remains on the surface in shadow, whereas the exposure to radiation, electrons and ions on the surface 13 to be cleaned prevents the stable compound from forming permanently. As a result, a proportion of the deposited contaminants 24 are repeatedly able to form a volatile compound with the cleaning gas, vaporize and make their way to the surface 14 in shadow.

The cleaning mechanism can be explained by reference to the embodiments shown in FIGS. 4 and 5. Radiation 21 from the light source is reflected, 22, at that surface 20 of the collector that is to be cleaned. Contaminants 23 also make their way from the radiation source 1 to the surface 20 and are deposited there, 24. The contaminants 24 are also able to enter into stable, non-volatile compounds 25 on the surface 20. Such compounds 25 may dissociate, 26, as a result of the impingement of photons 21 or electrons or ions 27 from the hot plasma at the radiation source 1. The reactive gas 29 that is admitted by means of the reactive-gas inlet 28 reacts with the deposited material 24 that has been released or has not yet reacted. The volatile compound 31 vaporizes and at least part of it diffuses to the surface 32 situated opposite, which is in shadow in relation to the light source. Getter gas 34 can be fed in through a getter-gas inlet 33. The getter substance may however also be present in the form of a layer 35 on the surface 32 in shadow, which is also referred to as a getter surface. By reacting, 36, with the getter substance, the volatile compound 31 is changed into the more stable non-volatile compound 37.

It is useful for the reactive-gas inlet 28 for the reactive gas 29 to be aimed at the surface 20 to be cleaned and for the getter-gas inlet 33 for the getter gas 34 to be aimed at the surface 32 in shadow on which the contaminants are to be precipitated. In this way, preference is given to the desired reaction in each case by differences in the concentration of the gases 29, 34.

As a form of embodiment, it may be useful for the gas inlets to be incorporated in the surfaces in, for example, the form of pores, as is shown by way of example in FIG. 5 in the case of the surface in shadow.

It is also helpful for the surface 32 in shadow to be structured in such a way that its surface area is maximized, in order to obtain a rate of surface reaction that is as high as possible and a capacity for coverage that is as large as possible.

This is particularly important if the getter substance 35 is present on the surface 32 in shadow in the form of a solid or liquid layer 35, because the cleaning action diminishes in this case if there is complete coverage by the non-volatile compound.

If the getter substance is in the form of a layer 35, this has the great advantage that the said getter substance is only present locally and cannot find its way to the surface 20 to be cleaned. To allow a beneficial effect to be exerted on the different reaction, vaporization and condensing processes, it is helpful for the temperatures of the surfaces 20, 32 to be controlled by means of a heating or cooling system. It is also advantageous for the temperature gradient between the warmer exposed surface and the colder surface in shadow to be enhanced as much as possible by employing a suitable thermal design for the collector 110.

For cooling purposes, cooling tubes through which cooling liquid flows could be mounted on the surfaces in shadow.

It may be advantageous for a means of thermal insulation, e.g. an air-gap, to be provided between the surface 32 in shadow and the exposed surface 20. The exposed surface is heated simply by the incident radiation alone. It should be borne in mind in this case that the optical properties of the surface are changed by heating thereof. It is therefore advantageous for a material to be used, at least for the exposed surface, which has good thermal conductivity, and for the temperature fluctuations on the exposed surface thus to be small. Allowance has to be made in the design for the desired temperature at the exposed surface.

The major proportion of the contaminants that make their way to the surface to be cleaned are contaminant material from the radiation source 1. These contaminants generally consist, first of all, of inorganic material. Of special interest are metals, and particularly tin, indium, antimony, lithium, tellurium, molybdenum and compounds thereof such as for example oxides, carbides and nitrides. Also of particular interest are carbon and carbon-containing compounds.

Gases that are suitable as cleaning gases, either in pure form or as mixtures, are: halogens, hydrogen or halogen-containing or hydrogen-containing compounds. Volatile compounds are then for example metal halides or metal-hydrogens.

Substances that are suitable as getter substances, either in pure form or as mixtures, are: oxygen, nitrogen, carbon or oxygen-containing, nitrogen-containing or carbon-containing compounds. Non-volatile compounds are then oxides, nitrides or carbides for example.

LIST OF REFERENCE NUMERALS

1 Radiation source
2 Vacuum vessel
3 Collector
4 Pumps
5 Intermediate focus
6
7 Debris suppression system
8
9
10 Collector shell
11 Light source
12 Light beams
13 Surface to be cleaned
14 Surface in shadow
15
16
17
18
19
20 Surface to be cleaned
21 Radiation
22 Reflected radiation
23 Contamination
24 Deposited contamination
25 Stable compound
26 Photon
27 Ions
28 Reactive-gas inlet
29 Reactive gas
30 Reaction with reactive substance
31 Volatile compound
32 Surface in shadow/getter surface
33 Getter-gas inlet
34 Getter gas/getter substance
35 Getter layer
36 Reaction with getter substance
37 Non-volatile compound
100 System for EUV lithography
110 Collector
111 Mirror system
112 Radiation source
113 Mirror
114 Inorganic substance
115 Deposit
116 Volatile compound
117 Vacuum system
118 Beam path
119 Reactant
120 Wafer

The invention claimed is:

1. An optical system for providing a radiation having a beam path defined by optical elements and having a cleaning arrangement for cleaning surface to be cleaned, the cleaning arrangement comprising a reactive-gas inlet, a getter surface arranged off the beam path, and a getter-gas inlet aimed at the getter surface.

2. The optical system as claimed in claim 1, wherein the getter surface has a getter coating.

3. The optical system as claimed in claim 1, wherein the getter surface is provided with a surface structure for enlarging a surface area of the getter surface.

4. The optical system as claimed in claim 1, wherein the reactive-gas inlet is aimed at the surface to be cleaned of an optical element.

5. The optical system as claimed in claim 1, wherein at least one of the getter-gas inlet and the reactive-gas inlet has a plurality of openings or an open porous structure.

6. The optical system as claimed in claim 1, wherein the getter surface is provided with a cooling system.

7. The optical system as claimed in claim 1, wherein, for heating optically active surfaces, the optical elements have a heating arrangement associated with them.

8. The optical system as claimed in claim 1, wherein the getter surface is arranged opposite or adjacent a surface of an optical element to which the radiation is applied.

9. The optical system as claimed in claim 1, comprising mirror surfaces arranged co-axially to one another, getter surfaces arranged between the mirror surfaces and opposite said mirror surfaces.

10. The optical system of claim 9, wherein the getter surfaces equidistant from the mirror surfaces.

11. The optical system as claimed in claim 1, characterized in that the openings of wherein the reactive-gas inlet has openings that are incorporated in the getter surface or in the surface to be cleaned or are arranged adjacent the surface to be cleaned.

12. The optical system of claim 1, wherein the radiation comprises extreme ultraviolet (EUV) radiation.

13. An optical system for providing a radiation having a beam path defined by optical elements and having a cleaning arrangement for cleaning surface to be cleaned, the cleaning arrangement comprising a reactive-gas inlet, a getter surface arranged off the beam path, and a getter-gas inlet having openings, wherein the openings of the getter-gas inlets are incorporated in the getter surface or are arranged at the getter surface.

14. A method of cleaning a surface comprising the acts of:
providing radiation to the surface to be cleaned;
applying a reactive gas to the surface to be cleaned for detaching contaminants from the surface to be cleaned;
aiming a getter-gas inlet at a getter surface; and
absorbing the detached contaminants by the getter surface by condensation and/or by chemical reaction.

15. The method as claimed in claim 14, wherein the getter gas comprises at least one of carbon-containing, nitrogen-containing, and oxygen-containing gas.

16. The method as claimed in claim 14, wherein the reactive gas comprises a halogen-containing gas or a hydrogen-containing gas.

17. The method as claimed in claim 14, wherein the applying act takes place in a pulsed manner.

* * * * *